United States Patent
Tsuduki et al.

(10) Patent No.: US 8,823,872 B2
(45) Date of Patent: Sep. 2, 2014

(54) IMAGE PICKUP MODULE WITH IMPROVED FLATNESS OF IMAGE SENSOR AND VIA ELECTRODES

(75) Inventors: Koji Tsuduki, Kawasaki (JP); Shin Hasegawa, Hadano (JP); Tadashi Kosaka, Atsugi (JP); Yasuhiro Matsuki, Atsugi (JP); Takanori Suzuki, Tokyo (JP); Akiya Nakayama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 426 days.

(21) Appl. No.: 13/212,935

(22) Filed: Aug. 18, 2011

(65) Prior Publication Data

US 2012/0044415 A1 Feb. 23, 2012

(30) Foreign Application Priority Data

Aug. 23, 2010 (JP) ................................ 2010-186464

(51) Int. Cl.
*H04N 5/225* (2006.01)
(52) U.S. Cl.
USPC ............................ 348/374; 348/375; 348/373
(58) Field of Classification Search
None
See application file for complete search history.

(56) References Cited

U.S. PATENT DOCUMENTS 5,365,656 A * 11/1994 Dahringer et al. ............... 29/840
7,656,041 B2 * 2/2010 Mochizuki et al. ........... 257/777
2004/0130640 A1 7/2004 Fujimori
2005/0274883 A1 * 12/2005 Nagano ........................ 250/239
2006/0231750 A1 * 10/2006 Chao et al. .................... 250/239
2007/0262381 A1 11/2007 Kojima
2009/0211793 A1 8/2009 Nakano
2009/0256260 A1 * 10/2009 Nakamura .................... 257/758
2009/0284631 A1 * 11/2009 Matsuo et al. ................ 348/294

FOREIGN PATENT DOCUMENTS

| CN | 1744302 A | 3/2006 |
| CN | 101055866 A | 10/2007 |
| JP | 2007-305804 A | 11/2007 |
| JP | 2008-211451 A | 9/2008 |
| JP | 2009-158863 A | 7/2009 |

* cited by examiner

*Primary Examiner* — Aung S Moe
*Assistant Examiner* — Euel Cowan
(74) *Attorney, Agent, or Firm* — Canon USA Inc IP Division (57) ABSTRACT

An image pickup module includes a cover member, an image pickup device chip including photodiodes, a fixing member which is arranged around the image pickup device chip and which connects the cover member and the image pickup device chip together, a rewiring substrate arranged on the side opposite to the cover member of the image pickup device chip, connection members for connecting the image pickup device chip with the rewiring substrate, and a space surrounded by the cover member, the image pickup device chip, and the fixing member. The image pickup device chip includes a semiconductor substrate. The semiconductor substrate includes through-hole electrodes penetrating the substrate. When an area corresponding to the fixing member in the orthogonal projection of the image pickup module with respect to the cover module is defined as a fixed area, the through-hole electrodes and the connection members are arranged in the fixed area.

13 Claims, 7 Drawing Sheets

IMAGE PICKUP MODULE WITH IMPROVED FLATNESS OF IMAGE SENSOR AND VIA ELECTRODES

BACKGROUND OF THE INVENTION

1. Field of the Invention

The present invention relates to an image pickup module and a camera.

2. Description of the Related Art

A conventional image pickup apparatus includes a WL-CSP (wafer level chip size package) in which a semiconductor substrate including an image pickup device and through-hole electrodes is bonded to a light transmissive support substrate via an adhesive having an opening on the image pickup device. Japanese Patent Laid-Open No. 2009-158863 discloses an image pickup module in which a semiconductor substrate is directly mounted on a mounting substrate via solder balls. The solder balls are formed on a large area in a second main surface of the semiconductor substrate opposite to a first main surface of the semiconductor substrate on which an image pickup device is formed. Here, the inventors found the problem described below. The thickness of a semiconductor substrate of an image pickup device chip including through-hole electrodes is thinner than the thickness of a semiconductor substrate of an image pickup device chip using wire bonding so as to improve throughput and reliability of a manufacturing process of the through-hole electrodes, so the rigidity of the semiconductor substrate is low. When connecting an image pickup device chip with a mounting substrate by soldering, the melted solder starts solidifying from a portion where the temperature falls below the melting point of the solder. Therefore, in the image pickup device chip which has been cooled to a room temperature, there is a difference of contraction between a portion where the solder attaches and a portion where no solder attaches. Thus, in Japanese Patent Laid-Open No. 2009-158863, when an image pickup device is connected with a mounting substrate via solder balls arranged below a hollow portion, concaves and convexes are formed in the image pickup device chip according to positions of solders, so the flatness of a light receiving surface decreases. Therefore, there is a problem that image quality degrades.

To solve the above problem, if the thickness of the semiconductor substrate of the image pickup device chip is increased simply, the flatness of the light receiving surface is improved because the rigidity increases. However, the through-hole electrodes become difficult to be formed.

The present invention is to solve the problem of such a conventional configuration, and the present invention provides an image pickup module and a camera in which the light receiving surface of the image pickup device chip including through-hole electrodes has a good flatness and which can obtain a high quality image.

SUMMARY OF THE INVENTION

The present invention provides an image pickup module including a cover member, an image pickup device chip including a photodiode, a fixing member arranged around the image pickup device chip and configured to connect the cover member and the image pickup device chip together, a rewiring substrate arranged on the side opposite to the cover member of the image pickup device chip, a connection member configured to connect the image pickup device chip with the rewiring substrate, and a space surrounded by the cover member, the image pickup device chip, and the fixing member. The image pickup device chip includes a semiconductor substrate. The semiconductor substrate includes a through-hole electrode penetrating a first main surface on the side of the cover member and a second main surface on the side opposite to the first main surface. When an area corresponding to the fixing member in the orthogonal projection of the image pickup module with respect to the cover module is defined as a fixed area, the through-hole electrode and the connection member are arranged in the fixed area.

Further features of the present invention will become apparent from the following description of exemplary embodiments with reference to the attached drawings.

DESCRIPTION OF THE EMBODIMENTS

Hereinafter, embodiments of the present disclosure will be described with reference to FIGS. 1A to 7.

First Embodiment

Figure 1A:
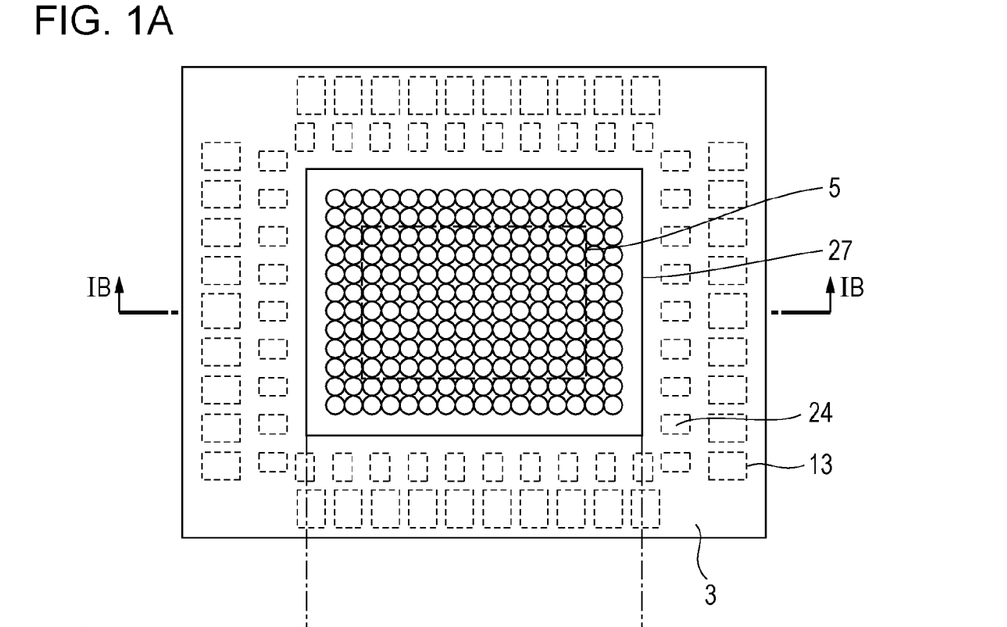
FIG. 1A is a transparent plan view of an image pickup module of a first embodiment.
Figure 1B:
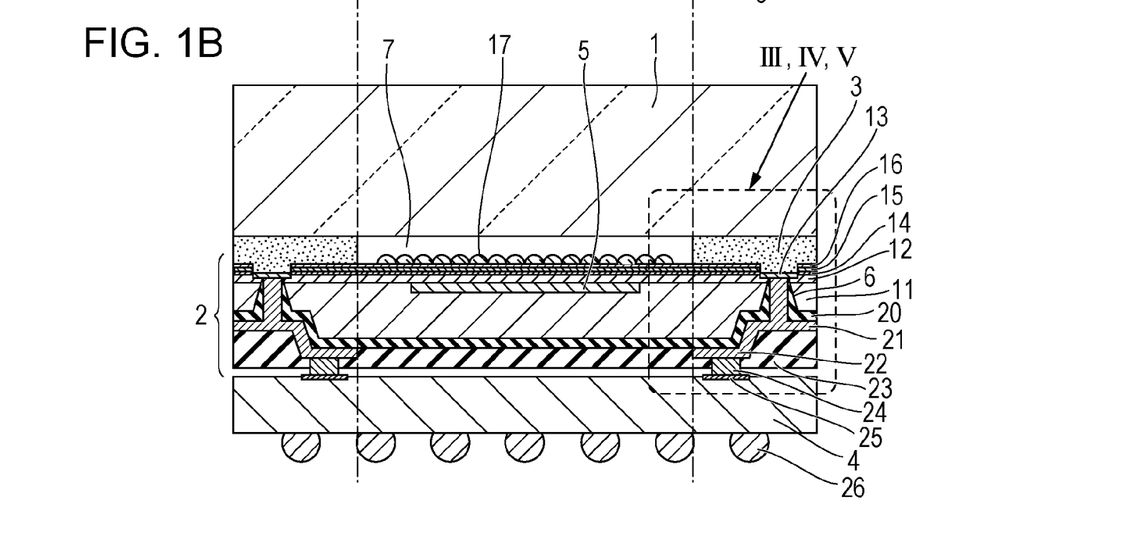
FIG. 1B is a cross-sectional view of the image pickup module of the first embodiment.

FIGS. 1A and 1B are diagrams showing an image pickup module of a first embodiment. FIG. 1A is a transparent plan view. FIG. 1B is a cross-sectional view taken along line IB-IB in FIG. 1A.

The image pickup module includes a cover member 1, an image pickup device chip 2, a fixing member 3 disposed between the cover member 1 and the image pickup device chip 2, and a rewiring substrate 4 electrically connected to the image pickup device chip 2. The image pickup device chip 2 has through-hole electrodes 6 around an image pickup area 5 including a plurality of photodiodes.

The cover member 1 is a portion through which incident light passes to the photodiodes, which are photo detectors of the image pickup device 2, and has at least a light transmissive property. The cover member 1 having a light transmissive property is formed of a crystal, a glass, a resin, or the like. When the semiconductor substrate 11 used for the image pickup device 2 is made of silicon, the glass can be TEMPAX Float (registered trademark) by SCHOTT AG, PYREX (registered trademark) by Corning Incorporated, SW glass substrate by ASAHI GLASS CO., LTD. When the cover member 1 is a resin, optical plastic formed of a polycarbonate resin can also be used. The cover member formed of the resin or the glass can be used because the resin and the glass are materials having a linear expansion coefficient similar to that of silicon. A silicon substrate is mainly used for the semiconductor substrate 11 for forming the photodiodes of the image pickup device chip 2. An adhesive for fixing the cover member 1 and the image pickup device chip 2 is used for the fixing member 3. The fixing member 3 is formed on a surface of at least either one of the cover member and the image pickup device chip by, for example, patterning.

The cover member 1 and the image pickup device chip 2 are fixed (i.e. connected or attached) together by the fixing member 3. A space 7 is formed by being surrounded by the cover member 1, the image pickup device chip 2, and the fixing member 3. A wiring structure 12, a first flattening film 14, a color filter 15, a second flattening film 16 are arranged on the semiconductor substrate of the image pickup device chip 2, and further microlenses 17 are arranged on the semiconductor substrate. An insulating film 20, an electroconductive film 21, and an insulting member 23 are arranged below the semiconductor substrate 11 (on the side opposite to the light incident side). An oxide film, a nitride film, or the like is used for the insulating film 20. Al, Cu, or the like is used for the electroconductive film 21. A solder resist or the like is used for the insulting member 23. The image pickup device chip 2 includes the through-hole electrodes 6 penetrating a first main surface on the side of the cover member, which is the light incident side of the semiconductor substrate 11, and a second main surface on the side opposite to the first main surface. The through-hole electrode 6 is formed by a part of the electroconductive film 21. The through-hole electrode 6 is electrically connected to a surface electrode 13 in the wiring structure. The image pickup device chip 2 has back surface electrodes 22 formed by a part of the electroconductive film 21 to connect to the rewiring substrate 4. The rewiring substrate 4 has first connection terminals 25 arranged on a first main surface on the side of the image pickup device chip and second connection terminals 26 arranged on a second main surface opposite to the main surface. Further, the rewiring substrate 4 has electroconductive members not shown in the drawings, which connect the first connection terminals 25 with the second connection terminals 26. The image pickup device chip 2 and the rewiring substrate 4 are electrically connected to each other by the back surface electrodes 22 of the image pickup device chip 2 and the first connection terminals 25 of the rewiring substrate 4 via connection members 24. An anisotropic electroconductive member is used for the connection member 24 in the present embodiment. For example, an anisotropic electroconductive member such as ACP, ACF, or NCP can be used. Solder can be used as the connection member 24.

Figure 2A:
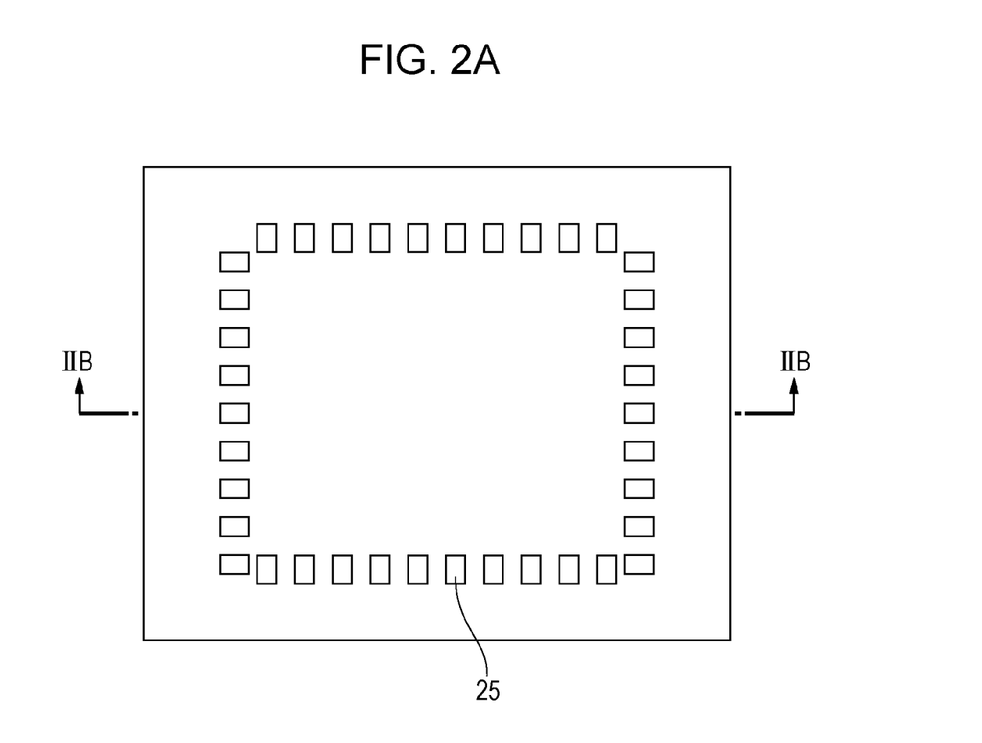
FIG. 2A is a plan view of a rewiring substrate of the image pickup module of the first embodiment.
Figure 2B:
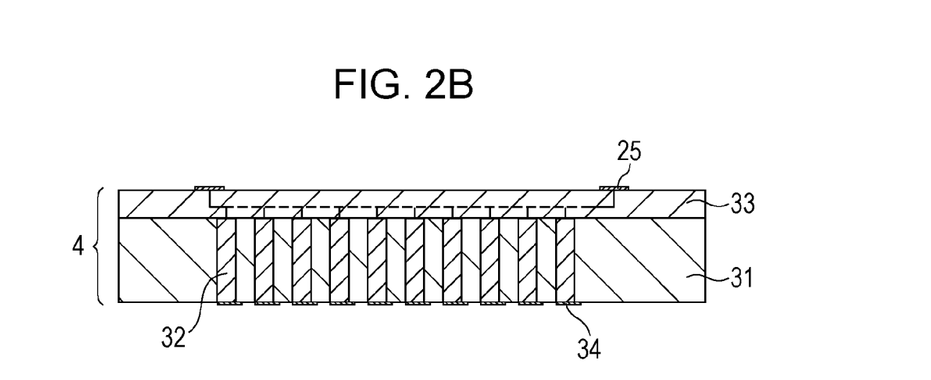
FIG. 2B is a cross-sectional view of the rewiring substrate of the image pickup module of the first embodiment.

Here, the rewiring substrate 4 will be described with reference to FIGS. 2A and 2B. The rewiring substrate 4 has a silicon substrate 31, through-hole electrodes 32 formed in the silicon substrate, a wiring structure 33 on the silicon substrate, surface electrodes 25 on the first main surface, and back surface electrodes 34 on the second main surface. An electroconductive pattern for rewiring is formed in the rewiring structure 33. By such a structure, the first connection terminals 25, which are the surface electrodes 25 of the rewiring substrate 4, are connected with the second connection terminals 34, which are the back surface electrodes of the rewiring substrate 4, to form a rewiring structure. A solder ball or the like is formed on the back surface electrode of the rewiring substrate 4 and used to connect to another mounting substrate not shown in the drawings. By using such a rewiring substrate, solder terminals can be formed in a matrix form on the second main surface of the rewiring substrate 4, so a structure capable of connecting to many pins can be formed. The material of the rewiring substrate 4 is not particularly limited, and a ceramic laminated substrate, a multilayer epoxy substrate, a silicon substrate, or the like can be used. However, if the semiconductor substrate 11 and the rewiring substrate 4 are silicon substrates, they have the same linear expansion coefficient and warping can be prevented from occurring. In this case, even if a flexible substrate or a glass epoxy substrate is connected to the rewiring substrate 4 using a silicon substrate, a stress due to a difference between thermal shrinkage rates of the rewiring substrate 4 and the connected substrate is difficult to be transmitted to a light receiving surface of the image pickup device chip 2, so a high flatness can be obtained.

Next, a plan view layout of the image pickup module will be described with reference to FIG. 1A. The plan view layout is, for example, orthogonal projections of the constituent elements with respect to the cover member 1. In the image pickup module, an area where the fixing member 3 is arranged is defined as a fixed area when seen from the light incident side. The fixed area is the outside of the inner circumference 27 of the fixing member 3. An area including the image pickup area inside the inner circumference 27 of the fixing member 3 is defined as a device area. In the fixed area, electrode units such as the surface electrodes 13, the through-hole electrodes 6, and the connection members 24 are arranged in the fixed area. The semiconductor substrate 11 has an area having a first thickness and an area having a second thickness thinner than the first thickness. The through-hole electrodes 6 are provided in the area having the second thickness. A boundary at which the thickness of the semiconductor substrate 11 of the image pickup device chip 2 changes is arranged below the fixing member, that is, in a range of the fixed area when seen from the light incident side. The connection members 24 electrically connecting the image pickup device chip 2 with the rewiring substrate 4 are arranged in a range of the fixed area. Although the boundary at which the thickness changes may corresponds to the boundary of the fixed area in the orthogonal projection of the cover member 1, the boundary at which the thickness changes is desired to be inside the fixed area. Although the inner edge of the connection member 24 may corresponds to the boundary of the fixed area in the orthogonal projection of the cover member 1, the inner edge of the connection member 24 is desired to be arranged inside the fixed area. This structure will be described with reference to FIG. 3, which is an enlarged diagram of a portion III in FIG. 1B.

Figure 3:
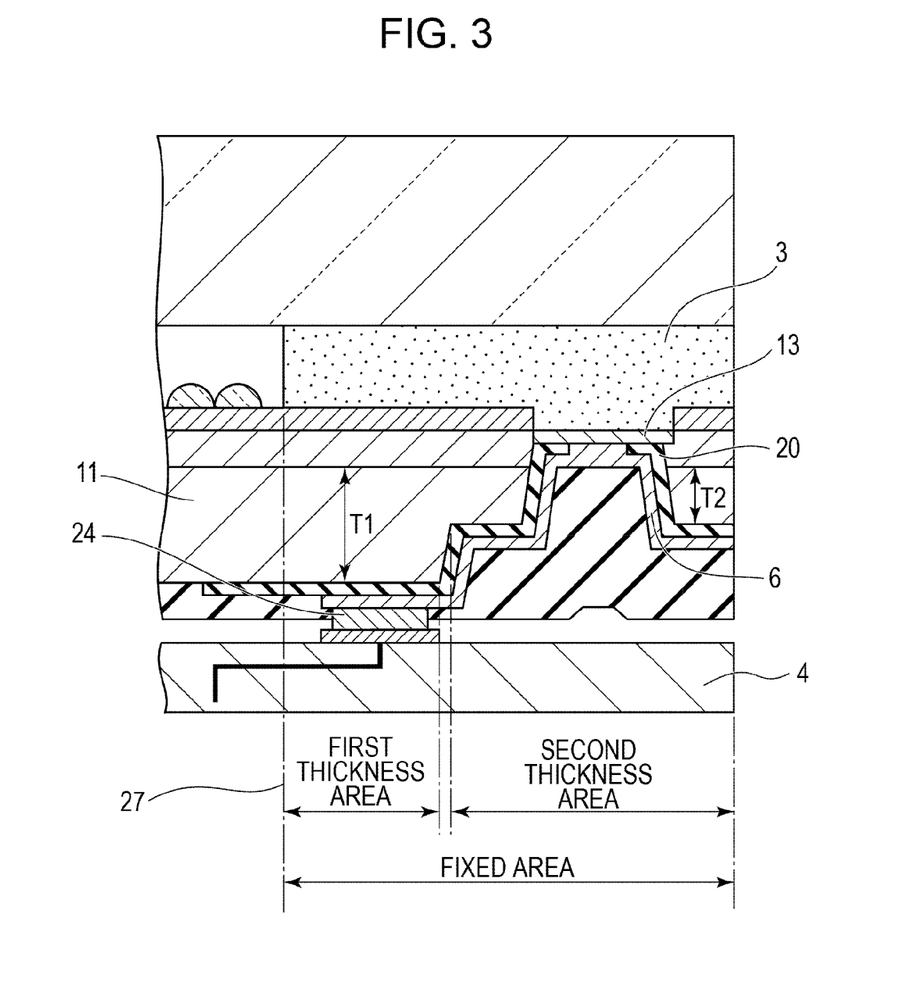
FIG. 3 is a partial cross-sectional view of the image pickup module of the first embodiment.

As shown in FIG. 3, the fixed area includes an area in which the semiconductor substrate has a first thickness T1 and an area in which the semiconductor substrate has a second thickness T2 thinner than the first thickness T1. As a method for thinning the thickness of the semiconductor substrate, at least either one of etching and grinding is used. The through-hole electrodes 6 and the connection members 24 are arranged in a range of the fixed area. The connection members 24 are arranged in the area having the first thickness T1 and the through-hole electrodes 6 are arranged in the area having the second thickness T2. The area having the first thickness T1 has high rigidity because the area is in the fixed area and is a portion where the thickness of the semiconductor substrate is large. Therefore, by arranging the connection members 24 in the area having the first thickness T1, which is a thicker portion of the semiconductor substrate 11, it is possible to reduce the influence of stress applied to the semiconductor substrate 11 when the connection members 24 are formed. Since the area having the first thickness T1 has high rigidity, a necessary pressure can be applied during a connection operation, and so electrically and mechanically stable connection can be achieved. Further, by arranging the through-hole electrodes 6 in the area having the second thickness T2, which is a thinner portion of the semiconductor substrate 11, it is possible to easily form the through-hole electrodes 6 in the semiconductor substrate 11. When electrical connection portions are provided in the area having the thickness T1 under the adhesive, the rigidity increases because the area is below the fixing member and is a thicker portion of the silicon. Therefore, an appropriate pressure can be applied when the connection operation is performed, so that a stable connection can be made, and the yield rate and reliability can be improved. Further, since the connection members are not arranged below the space, that is, in a range of the device area, it is possible to reduce the influence of the stress applied to the semiconductor substrate due to contraction of the solder.

Therefore, in the image pickup module, a light receiving surface, which is the surface of the image pickup area, has a good flatness, and so a high quality image can be obtained.

Next, a modified example of the image pickup module in FIG. 1B will be described with reference to FIG. 4.

Figure 4:
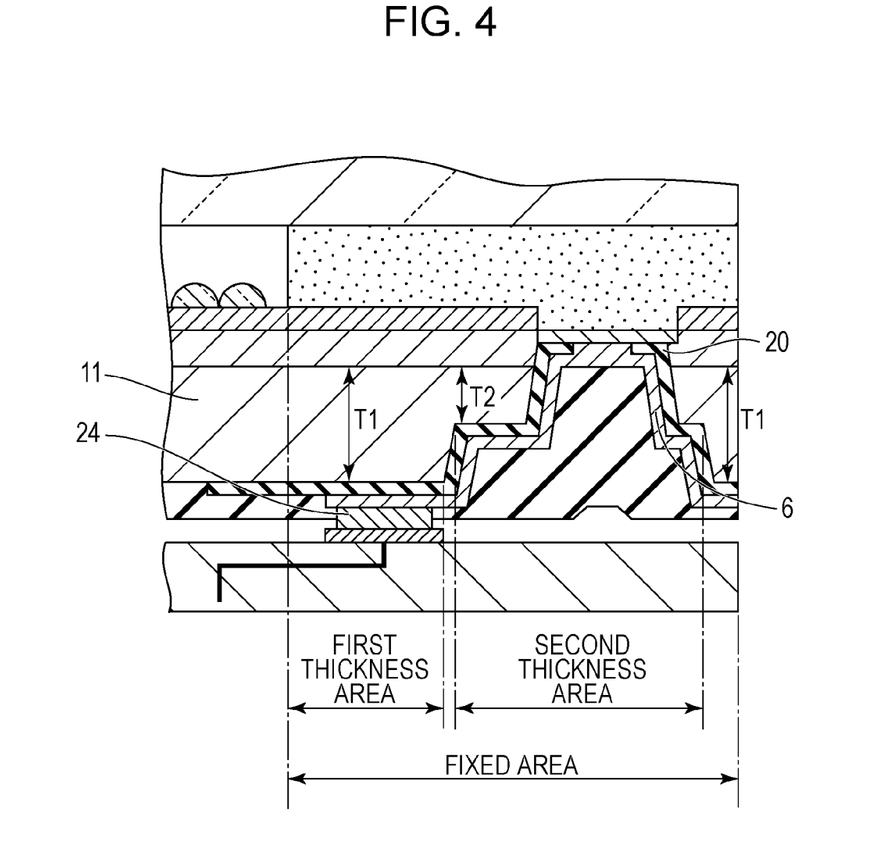
FIG. 4 is a partial cross-sectional view of an image pickup module of a modified example of the first embodiment.

FIG. 4 is a partial cross-sectional view corresponding to a portion IV in FIG. 1B in the same manner as in FIG. 3.

A configuration of the image pickup module of FIG. 4 different from the configuration of FIGS. 1B and 3 is that the edge of the semiconductor substrate 11 outside the through-hole electrodes has the first thickness T1. Even if there are areas having the first thickness T1 at both sides of the area having the second thickness T2 in this way, the same effect can be obtained.

Next, a modified example of the image pickup module in FIG. 1B, which is different from the image pickup module in FIG. 3, will be described with reference to FIG. 5.

Figure 5:
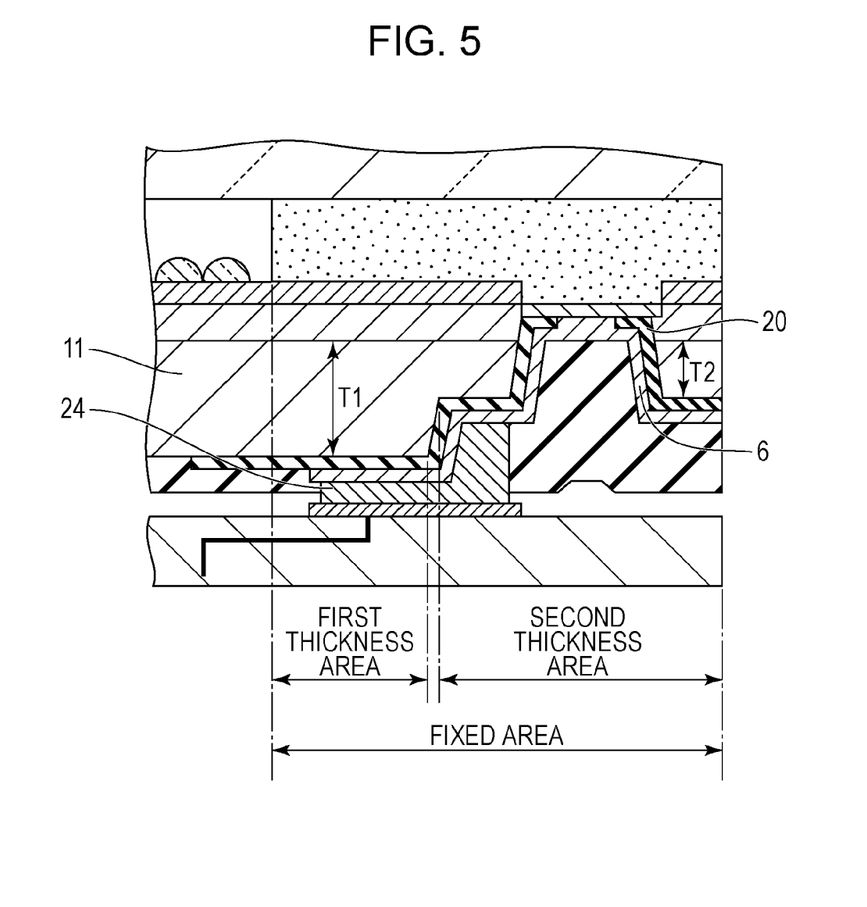
FIG. 5 is a partial cross-sectional view of an image pickup module of a modified example of the first embodiment.

FIG. 5 is a partial cross-sectional view corresponding to a portion V in FIG. 1B in the same manner as in FIG. 3.

A configuration of the image pickup module of FIG. 5 different from the configuration of FIGS. 1B and 3 is that the connection members 24 are arranged from the area having the first thickness T1 to the area having the second thickness T2. In this way, by enlarging the connection area of the connection members 24, the yield rate and reliability can be further improved.

As described above, by the image pickup module described in the present embodiment, an image pickup module can be obtained in which the light receiving surface of the image pickup device chip including through-hole electrodes has a good flatness and which can obtain a high quality image.

In a conveyer type reflow furnace in which solder is formed, fixation timing of a plurality of solder balls when the solder balls come out from the furnace varies depending on the positions of the solder balls. However, the connection is performed in an area having high rigidity, so that the variation is reduced and high flatness of the light receiving surface is maintained.

Second Embodiment

Figure 6A:
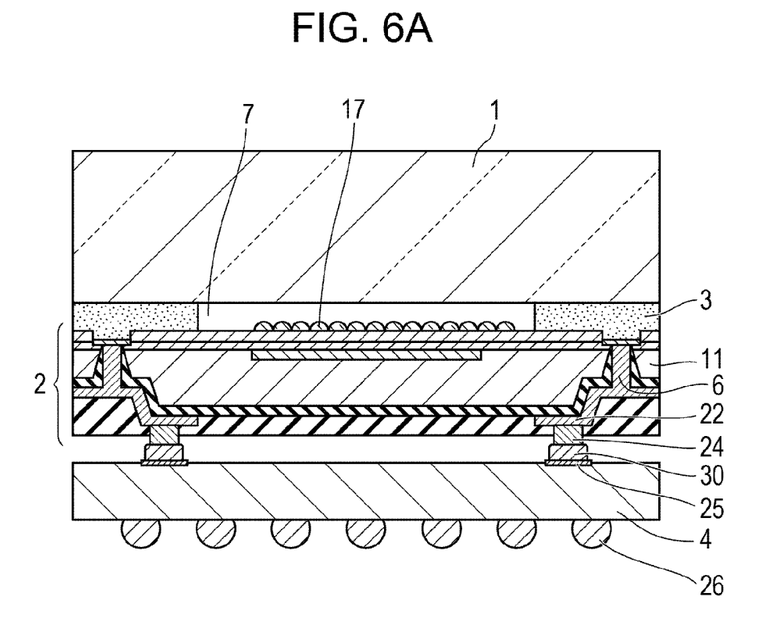
FIG. 6A is a cross-sectional view of an image pickup module of a second embodiment.
Figure 6B:
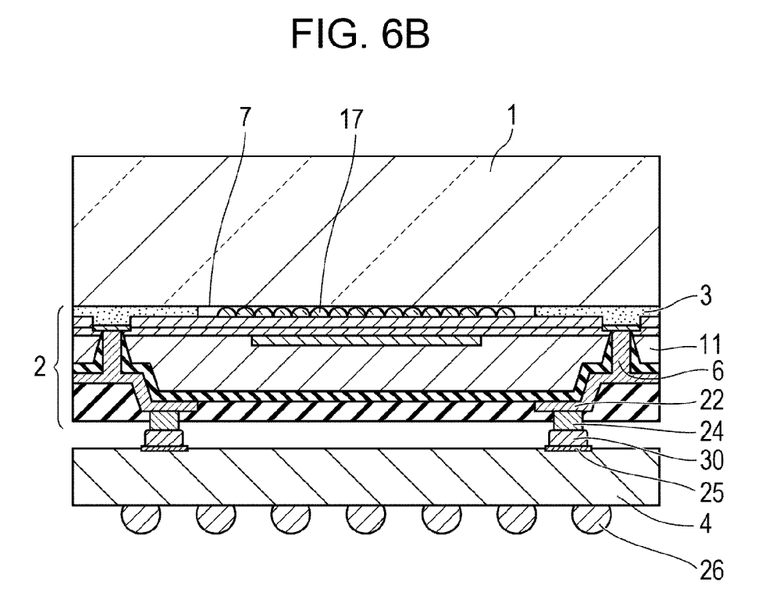
FIG. 6B is a cross-sectional view of the image pickup module of the second embodiment.

FIGS. 6A and 6B are cross-sectional views of an image pickup module of a second embodiment of the present disclosure.

A point different from the image pickup module in FIG. 1B is that a bump electrode is arranged on the surface electrode of the rewiring substrate. The bump electrode is a gold bump or a solder bump, and arranged on the first connection terminal, which is the surface electrode of the rewiring substrate.

The bump electrode 30 and the back surface electrode 22 of the image pickup device chip 2 are connected to each other by an anisotropic electroconductive member in the same manner as in the first embodiment. When the bump electrode 30 is used, an electroconductive adhesive may be provided to each bump and connected.

By using the bump electrodes 30, the connection between the image pickup device chip 2 and the rewiring substrate 4 becomes a plurality of point contacts, so the load during connection can be largely reduced and it is possible to further prevent the semiconductor substrate 11 from being deformed or cracked.

The differences between FIG. 6A and FIG. 6B are the thickness of the fixing member 3, that is, the size of the space 7, and whether or not the cover member 1 is in contact with the microlenses 17. The configuration of FIG. 6B has further higher rigidity, so the light receiving surface has high flatness. These configurations can be applied to the configuration of the first embodiment.

Third Embodiment

Application to Digital Camera

Figure 7:
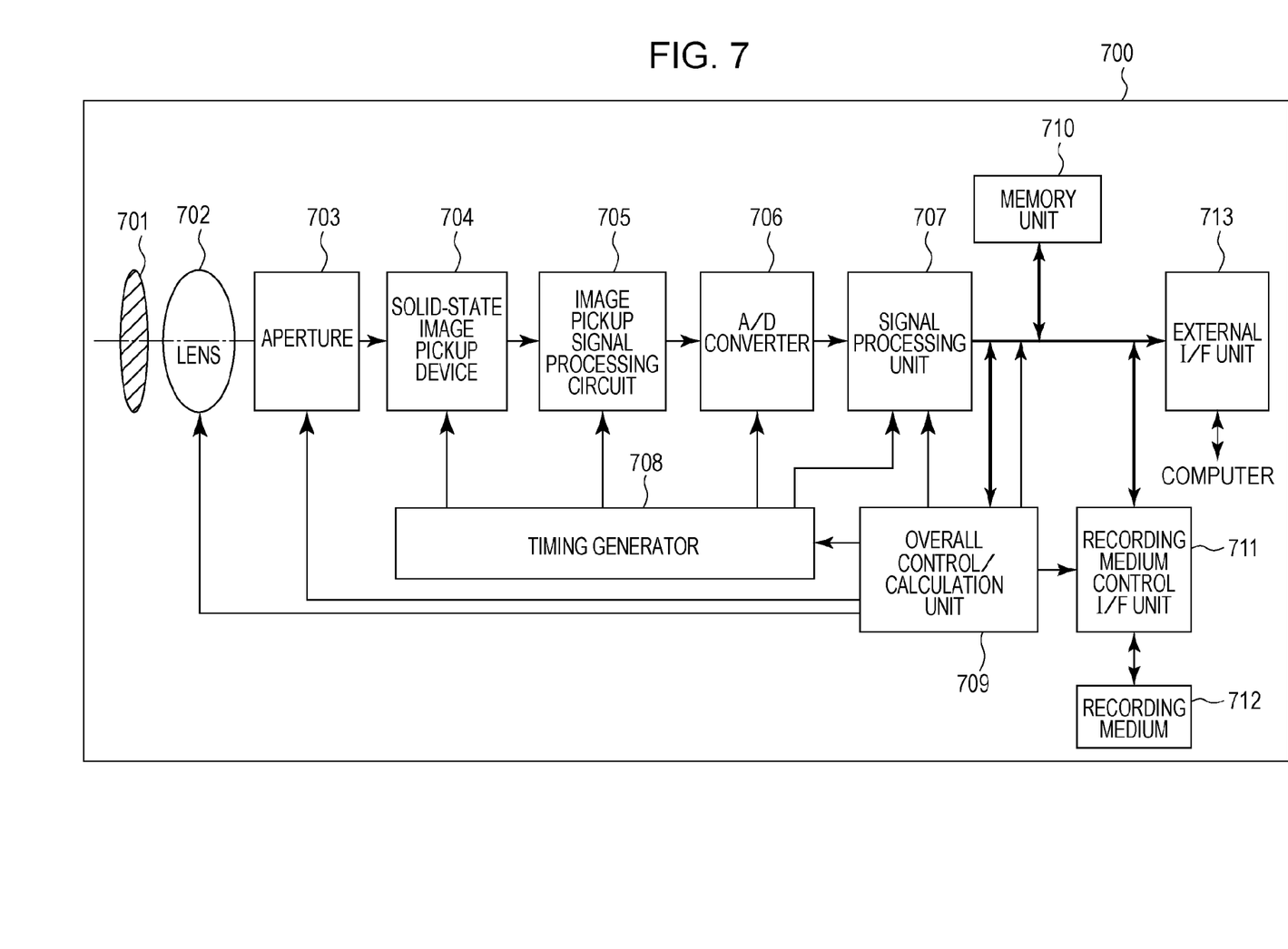
FIG. 7 is a block diagram in which an image pickup module is applied to a digital camera, which is an example of an image pickup system.

FIG. 7 is a block diagram in which the image pickup module described in the first and the second embodiments of the present invention is applied to a digital camera, which is an example of an image pickup system.

A configuration for bringing light in a solid-state image pickup device 704 includes a shutter 701, an image pickup lens 702, and an aperture 703. The shutter 701 controls exposure of the solid-state image pickup device 704, and the incident light is focused on the solid-state image pickup device 704 by the image pickup lens 702. At this time, the light quantity is controlled by the aperture 703.

A signal outputted from the solid-state image pickup device 704 according to the light brought in is processed in an image pickup signal processing circuit 705 and converted from an analog signal to a digital signal by an A/D converter 706. The outputted digital signal is calculated by a signal processing unit 707 and picked-up image data is generated. The picked-up image data can be accumulated in a memory 710 mounted in the digital camera or transmitted to an external device such as a computer or a printer through an external I/F unit 713 according to setting of operation mode set by a user. The picked-up image data can also be recorded in a recording medium 712 that can be attached and detached to and from the digital camera through a recording medium control I/F unit 711.

The solid-state image pickup device 704, the image pickup signal processing circuit 705, the A/D converter 706, and the signal processing unit 707 are controlled by a timing generator 708, and the entire system is controlled by an overall control/calculation unit 709. The above system can also be formed on the same semiconductor substrate as that of the solid-state image pickup device 704 by the same process.

The embodiments described above can be properly combined or properly modified.

While the present invention has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2010-186464 filed Aug. 23, 2010, which is hereby incorporated by reference herein in its entirety.

What is claimed is:

1. An image pickup module, comprising:
   an image pickup device chip having a first area and a second area around the first area, the first area including a plurality of photodiodes in a semiconductor substrate and the second area including a through-hole electrode penetrating the semiconductor substrate;
   a cover member facing the image pickup device chip;
   a fixing member arranged between the second area of the image pickup device chip and the cover member, to connect the cover member and the image pickup device chip together and to form a space surrounded by the cover member, the first area of the image pickup device chip, and the fixing member;
   a rewiring substrate arranged so that the image pickup device chip is positioned between the cover member and the rewiring substrate, the rewiring substrate having a first connection terminal on a first surface facing the image pick up device chip, and a second connection terminal on a second surface opposite to the first surface; and
   a connection member arranged between the second area of the image pickup device chip and the rewiring substrate, to electrically connect the through-hole electrode of the image pickup device chip with the second connection terminal of the rewiring substrate via the first connection terminal;
   wherein the first connection terminal are arranged in an orthogonal projection of the second area, and the second connection terminal is arranged in an orthogonal projection of the first area.

2. The image pickup module according to claim 1, wherein a thickness of the semiconductor substrate is thinner in the second area than in the first area.

3. The image pickup module according to claim 1, wherein a boundary at which the thickness of the semiconductor substrate changes, is positioned in an orthogonal projection of the fixing member.

4. The image pickup module according to claim 1, wherein the semiconductor substrate includes a first portion having a first thickness in the first area, and a second portion having a second thickness thinner than the first thickness in the second area, the connection member is arranged in an orthogonal projection of a portion of the semiconductor substrate having the first thickness.

5. The image pickup module according to claim 1, wherein the connection member is an anisotropic electroconductive member or a solder.

6. The image pickup module according to claim 1, wherein the rewiring substrate includes a silicon substrate, and the semiconductor substrate of the image pickup device chip is made of silicon.

7. The image pickup module according to claim 1, wherein the rewiring substrate has a bump electrode disposed on the first connection terminal and the through-hole electrode of the image pickup device chip is electrically connected with the second connection terminal of the rewiring substrate via the bump electrode and the connection member.

8. A camera comprising:
   the image pickup module according to claim 1; and
   a signal processing unit configured to process a signal obtained by the image pickup module.

9. The image pickup module according to claim 1, wherein the rewiring substrate includes a flexible substrate, a glass epoxy substrate, a ceramic laminated substrate or a multilayer epoxy substrate.

10. The image pickup module according to claim 1, wherein
    the rewiring substrate has a silicon substrate, a through-hole electrodes in the silicon substrate, and a wiring structure between the semiconductor substrate and the silicon substrate.

11. The image pickup module according to claim 1, wherein a plurality of connection terminals including the first connection terminal are arranged on the first surface, and
    a plurality of connection terminals including the second connection terminal are arranged on the second surface.

12. The image pickup module according to claim 11, wherein the plurality of the connection terminals on the first surface are not arranged in the orthogonal projection of the first area but arranged in the orthogonal projection of the second area.

13. The image pickup module according to claim 11, wherein some of the plurality of the connection terminals on the second surface are arranged in the orthogonal projection of the first area, and some of the plurality of the connection terminals on the second surface are arranged in the orthogonal projection of the second area.

* * * * *